(12) United States Patent
Matsumoto

(10) Patent No.: US 7,541,670 B2
(45) Date of Patent: Jun. 2, 2009

(54) SEMICONDUCTOR DEVICE HAVING TERMINALS

(75) Inventor: Masafumi Matsumoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 122 days.

(21) Appl. No.: 11/554,251

(22) Filed: Oct. 30, 2006

(65) Prior Publication Data
US 2008/0001278 A1 Jan. 3, 2008

(30) Foreign Application Priority Data
Jun. 29, 2006 (JP) ............................. 2006-179983

(51) Int. Cl.
H01L 23/02 (2006.01)
(52) U.S. Cl. ................. 257/678; 257/700; 257/713; 257/741; 257/773; 257/776; 257/E23.181; 257/E23.182
(58) Field of Classification Search ......... 257/678–734, 257/749, 773–786, E23.001–E23.194; 174/50, 174/50.5, 58–61; 361/600
See application file for complete search history.

(56) References Cited

U.S. PATENT DOCUMENTS

| 6,060,772 | A | * | 5/2000 | Sugawara et al. | ............ 257/678 |
| 6,303,974 | B1 | * | 10/2001 | Irons et al. | ................... 257/584 |
| 6,703,699 | B2 | * | 3/2004 | Kawaguchi | ................. 257/678 |
| 6,885,097 | B2 | * | 4/2005 | Maeno et al. | ................ 257/698 |
| 6,914,321 | B2 | * | 7/2005 | Shinohara | .................... 257/678 |
| 7,161,235 | B2 | * | 1/2007 | Maeno | ........................ 257/691 |
| 2003/0011057 | A1 | * | 1/2003 | Nakajima et al. | ............ 257/678 |

FOREIGN PATENT DOCUMENTS

| DE | 299 00 370 U 1 | 5/1999 |
| DE | 101 20 402 A 1 | 11/2002 |
| EP | 0 513 410 A1 | 11/1992 |
| JP | 61-276353 | 12/1986 |
| JP | 7-153906 | 6/1995 |
| JP | 7-153907 | 6/1995 |
| JP | 9-8191 | 1/1997 |
| JP | 11-214608 | 8/1999 |
| JP | 2002-76259 | 3/2002 |

* cited by examiner

Primary Examiner—Jasmine J Clark
(74) Attorney, Agent, or Firm—Oblon, Spivak, McClelland, Maier & Neustadt, P.C.

(57) ABSTRACT

The power semiconductor package includes a semiconductor mounting substrate, a mother case having an opening and containing the semiconductor mounting substrate therein, a securing member having a plurality of securing positions formed along a rim constituting the opening, and a screw terminal and a pin terminal secured at the rim and electrically connected to the semiconductor mounting substrate. The screw terminal and the pin terminal are each secured by the securing member at one of the plurality of securing positions thereof. Thus, the package can adapt to variation in shape and arrangement of terminals due to differences in circuit configuration and the like of the semiconductor apparatuses, and can reduce restriction on the layout within the enclosure.

15 Claims, 12 Drawing Sheets

SEMICONDUCTOR DEVICE HAVING TERMINALS

BACKGROUND OF THE INVENTION

1. Field of the Invention

The present invention relates to a semiconductor device having terminals, and more particularly to a semiconductor device having terminals that can adapt to variation in arrangement of pin and screw terminals serving as electrodes.

2. Description of the Background Art

Power semiconductor packages for semiconductor apparatuses used for inverter drive of industrial equipment and the like have various configurations such as CIB, 7 in 1, 6 in 1, and 2 in 1. CIB refers to a package incorporating a converter, six inverters, and a brake. 7 in 1 refers to a package incorporating six inverters and a brake. 6 in 1 refers to a package incorporating six inverters, and 2 in 1 refers to a package incorporating two inverters.

In these power semiconductor packages, terminals differ in shape and arrangement from each other, due to differences in internal circuit, rating and specification of the semiconductor apparatuses from each other, and thus, the packages of different configurations with terminals of different shapes and arrangements are conventionally manufactured separately. This however requires a large cost for prototyping of the packages, and for manufacture of different molds for mass-production thereof. Further, there is a need to address problems that would occur in the packages of various configurations, which causes delay in development, and requires time to verify those packages. To solve the above-described problems, a power semiconductor package adaptable to variation in shape and arrangement of terminals has been demanded.

Japanese Patent Laying-Open No. 09-008191 discloses a power semiconductor device that can change the connecting position of an external lead electrode that is connected to a semiconductor element. Specifically, a semiconductor element is arranged in a casing, and a rectangular opening is formed at the upper surface of the casing. A plurality of holes are formed at the upper surface of the casing, along a pair of opposed sides of the opening. A lead electrode is attached to a terminal member. The terminal member has projections formed at respective ends of the lower surface. The projections are inserted to the holes formed at the one and the other sides, so that the terminal member is arranged to extend over the opening. The connecting position of the lead electrode can be changed by changing the holes to which the projections are to be inserted.

With the power semiconductor device of Japanese Patent Laying-Open No. 09-008191, however, the terminal member is arranged at the upper surface of the casing, which would largely restrict the layout inside the package.

SUMMARY OF THE INVENTION

An object of the present invention is to provide a semiconductor device that can adapt to variation in shape and arrangement of terminals attributable to differences in circuit configuration and the like of the semiconductor apparatuses, and that can reduce restriction on the layout inside the enclosure.

A semiconductor device of the present invention includes: a semiconductor mounting substrate; an enclosure having an opening and containing the semiconductor mounting substrate therein; a securing member having a plurality of securing positions formed along a rim constituting the opening; and a terminal secured at the rim and electrically connected to the semiconductor mounting substrate. The terminal is secured by the securing member at one of the plurality of securing positions.

According to the semiconductor device of the present invention, it is possible to adapt to variation in shape and arrangement of the terminals attributable to the differences in circuit configuration and the like of the semiconductor apparatuses, and it is also possible to reduce restriction on the layout inside the enclosure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
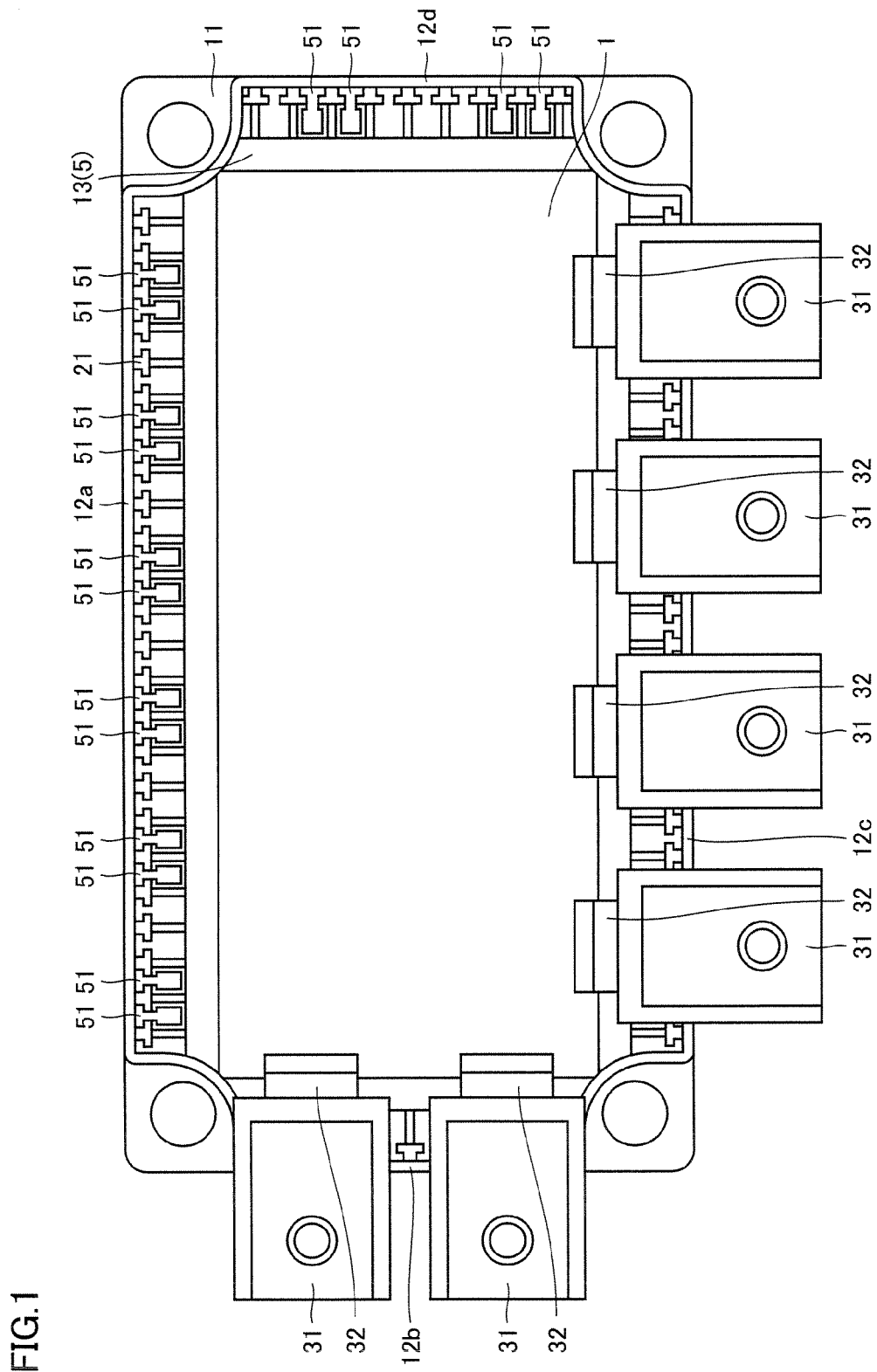
FIG. 1 is a top plan view showing a structure of a power semiconductor package according to a first embodiment of the present invention.
Figure 2:
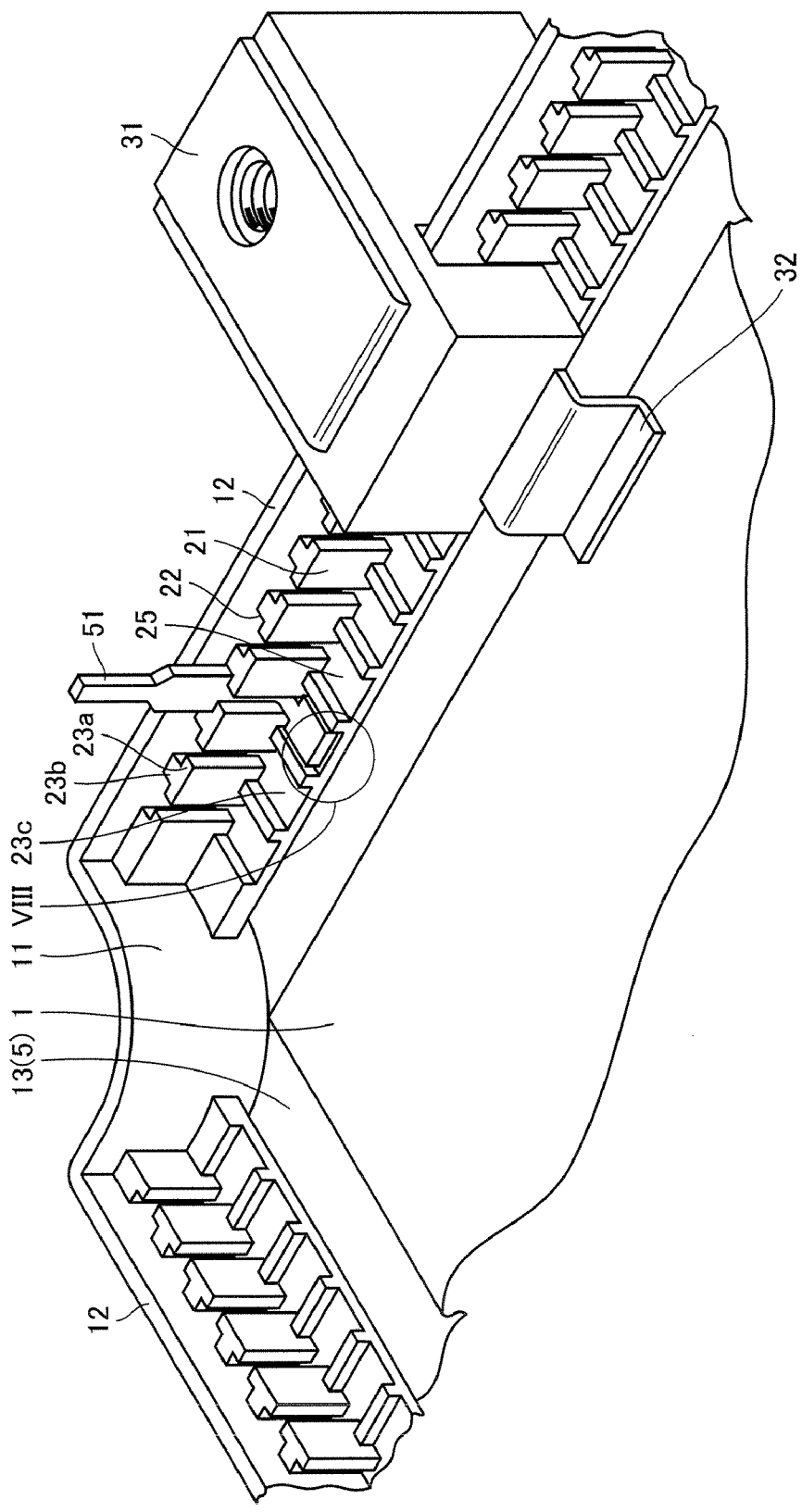
FIG. 2 is a perspective view schematically showing the way of securing terminals in the power semiconductor package in FIG. 1.

Referring to FIGS. 1 and 2, a power semiconductor package identified as the semiconductor device according to the present embodiment includes a base board 5, a semiconductor mounting substrate (insulating substrate) 1 rested thereon, a mother case 11 fixedly attached to base board 5 and serving as an enclosure, a securing member 21, and a screw terminal 31 and a pin terminal 51 as the terminals. Base board 5 is made of a material exhibiting excellent heat radiation, such as copper, copper alloy or the like, and semiconductor mounting substrate 1 is rested thereon. Semiconductor mounting substrate 1 is made of an insulating substrate of ceramic or the like, and a wiring pattern of copper foil or copper plate is formed on its surface, with a power semiconductor element and the like being fixedly attached on the wiring pattern. Mother case 11 is in an approximately rectangular shape, and has an opening 13. Semiconductor mounting substrate 1 is accommodated inside opening 13, as mother case 11 is fixedly attached to base board 5. A rim 12 constituting the opening 13 has primarily four sides 12a-12d. Sides 12a and 12c, and sides 12b and 12d of rim 12 are parallel to each other. Securing member 21 has a plurality of securing positions 22, which are formed along sides 12a-12d of rim 12. Each of screw terminal 31 and pin terminal 51 is secured at rim 12, or more specifically, secured using securing member 21 at an arbitrary securing position 22 thereof. In FIG. 1, 12 pin terminals 51 are arranged on side 12a, with a pair of pin terminals 51 being arranged at regular intervals. Two screw terminals 31 are arranged on side 12b. Four screw terminals 31 are arranged on side 12c at regular intervals, and four pin terminals 51, in units of pairs, are arranged on side 12d. Screw terminal 31 is electrically connected to semiconductor mounting substrate 1 by an electrode 32 incorporated in screw terminal 31 itself, while pin terminal 51 is electrically connected to semiconductor mounting substrate 1 by a wire (not shown).

Figure 3:
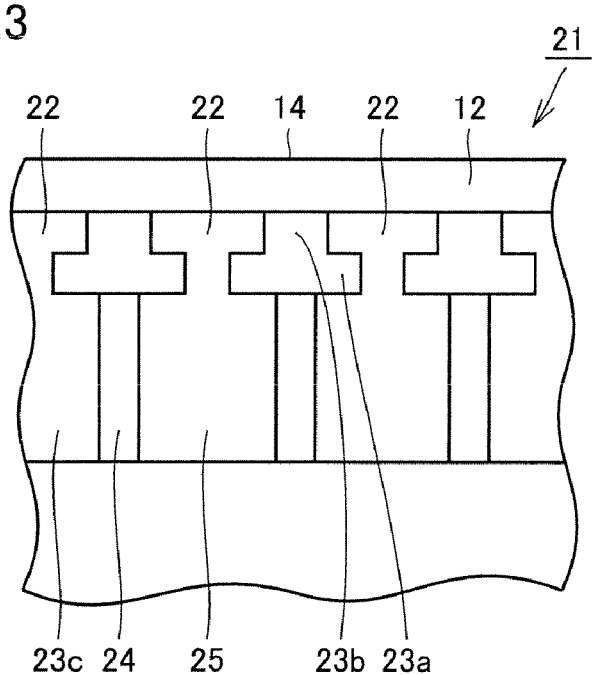
FIG. 3 is an enlarged view of a securing member and its vicinity in the power semiconductor package in FIG. 1.

Referring to FIG. 1-3, securing member 21 has a plurality of wall portions 23a, a plurality of connecting portions 23b, and a bottom portion 23c. Wall portions 23a each extend in parallel with rim 12, and are arranged along rim 12 at regular intervals. Connecting portions 23b each connect the corresponding wall portion 23a with rim 12, and are arranged along rim 12 at regular intervals. Wall portions 23a and rim 12 form a groove therebetween, which is partitioned by connecting portions 23b into a plurality of securing positions 22. Bottom portion 23c extends in a horizontal direction on one side of wall portions 23a opposed to the rim 12 side.

Bottom portion 23c has thick portions 24 and thin portions 25. Thin portions 25 are formed at the positions corresponding to the respective securing positions 22, and thick portions 24 are each formed between thin portions 25. That is, thick portions 24 and thin portions 25 are formed alternately along rim 12.

Mother case 11 and securing member 21 are made, e.g., of thermoplastic resin. The specific resin material may be PPS (polyphenylene sulfide), PBT (polybutylene terephthalate) or the like.

Figure 4:
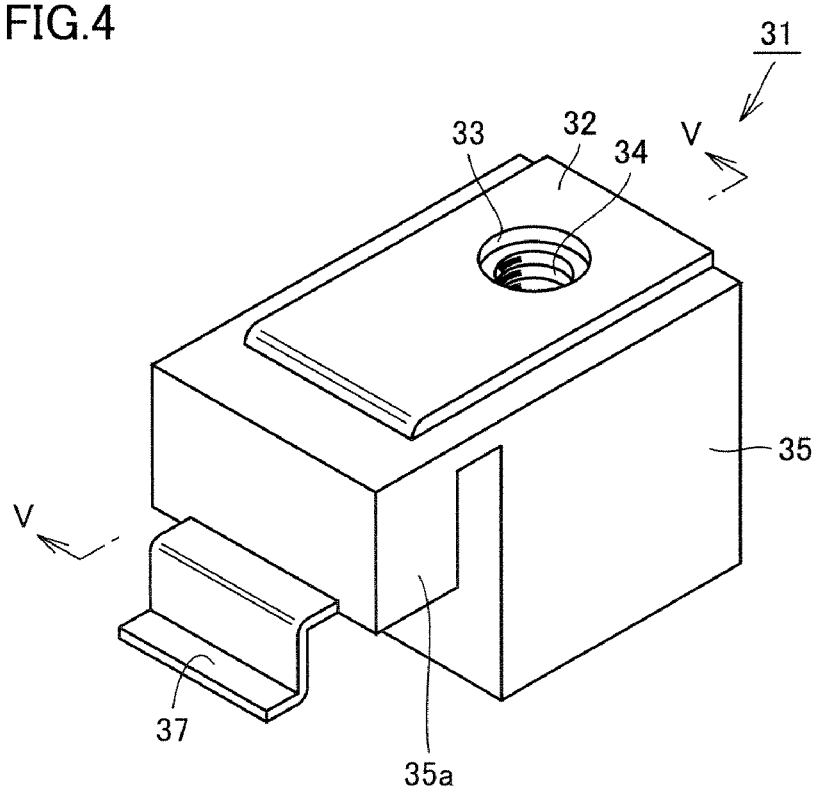
FIG. 4 is a perspective view showing a structure of a screw terminal in the power semiconductor package in FIG. 1.
Figure 5:
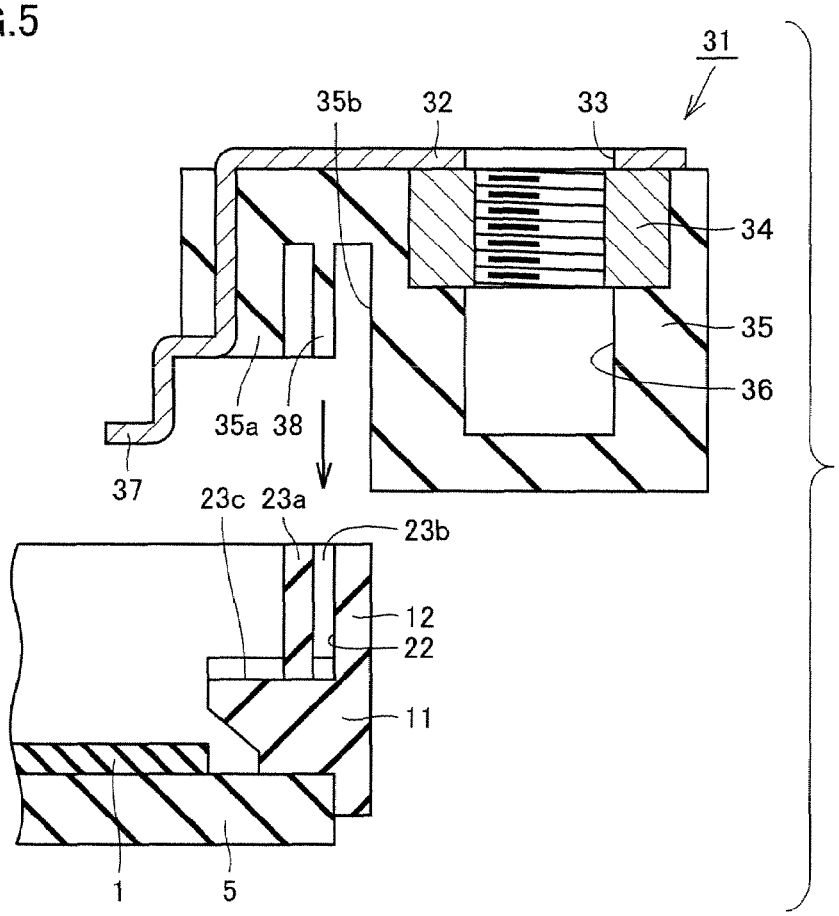
FIG. 5 is a cross sectional view showing how the screw terminal in FIG. 4 is secured to the power semiconductor package in FIG. 1.
Figure 6:
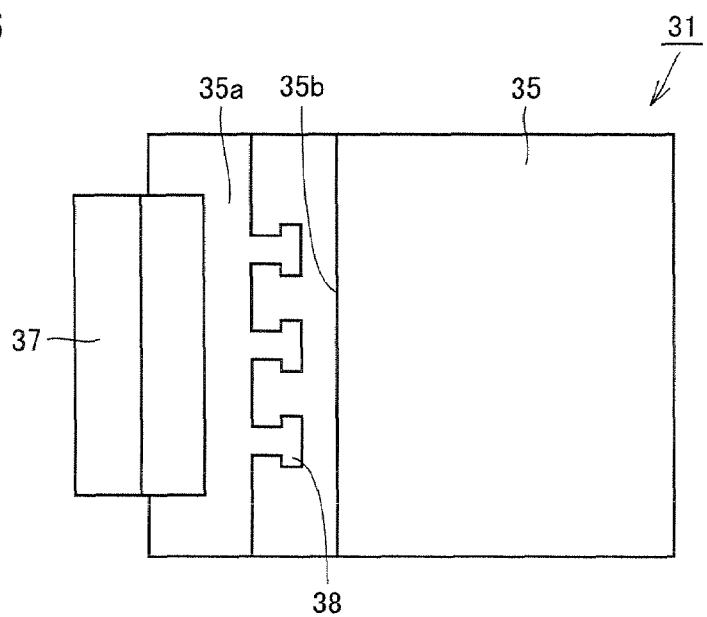
FIG. 6 is a bottom plan view of the screw terminal in FIG. 4.

FIGS. 4-6 show a structure of the screw terminal in the power semiconductor package in FIG. 1. In FIG. 5, the screw terminal is shown in cross section along the line V-V in FIG. 4. Referring to FIGS. 4-6, the screw terminal 31 has a screw terminal main body 35, a nut 34, an electrode 32, and a projection 38. Screw terminal main body 35 is in the form of a rectangular parallelepiped having an overhanging portion 35a that protrudes frontward and extends downward. A hollow portion 36 is formed at the upper surface of the rectangular parallelepiped portion of screw terminal main body 35. Nut 34 is secured at hollow portion 36, and electrode 32 is arranged on the upper surface of the rectangular parallelepiped portion of screw terminal main body 35. Electrode 32 covers nut 34, and has an opening 33 coaxial with nut 34. Electrode 32 penetrates through overhanging portion 35a and has its tip end portion 37 extending frontward and downward from overhanging portion 35a, while being held by overhanging portion 35a. Projection 38 extends from overhanging portion 35a toward a side surface 35b of the rectangular parallelepiped portion of screw terminal main body 35, and has its tip end spreading in the longitudinal direction in FIG. 6. Projection 38 has a shape corresponding to that of securing position 22 (FIG. 3).

Referring particularly to FIG. 5, projection 38 is fitted (press-fitted) to a desired securing position 22 from above, so that screw terminal 31 is secured to mother case 11. In the secured state of screw terminal 31, tip end portion 37 of electrode 32 contacts semiconductor mounting substrate 1, and a part of overhanging portion 35a is rested on bottom portion 23c. As a result, electrical connection is established between nut 34 and semiconductor mounting substrate 1. Screw terminal 31 extends from securing position 22 over rim 12 to the side portion of mother case 11. Screw terminal main body 35 and projection 38 are made of the same resin.

Figure 7:
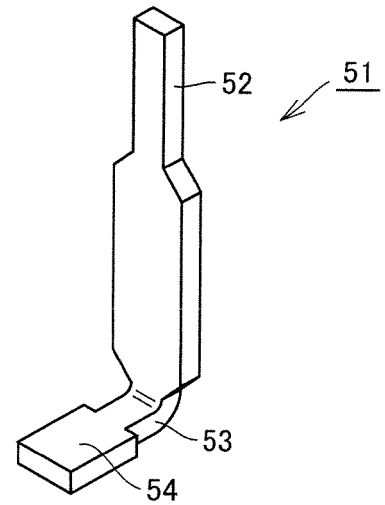
FIG. 7 is a perspective view showing a structure of a pin terminal in the power semiconductor package in FIG. 1.

FIG. 7 shows a structure of the pin terminal in the power semiconductor package in FIG. 1. Referring to FIG. 7, the pin terminal 51 has a projection 52, a bent portion 53, and a pin terminal bottom portion 54. Pin terminal bottom portion 54 has an approximately rectangular shape corresponding to thin portion 25 (FIG. 2). Projection 52 extends from an end of pin terminal bottom portion 54, perpendicular to pin terminal bottom portion 54. Projection 52 has its tip end portion narrower than the remaining portion. Bent portion 53 connects projection 52 with pin terminal bottom portion 54. Bent portion 53 is narrower than the bottom portion, and has a width corresponding to the gap between the adjacent two wall portions 23a (FIG. 2).

Referring to FIGS. 2 and 7, bent portion 53 and pin terminal bottom portion 54 are inserted through the gap between the adjacent two wall portions 23a and the gap between the adjacent two connecting portions 23b, to allow projection 52 to be fitted (press-fitted) to a desired securing position 22, and accordingly, pin terminal 51 is secured to mother case 11. In the secured state of pin terminal 51, pin terminal bottom portion 54 is arranged on thin portion 25.

Figure 8:
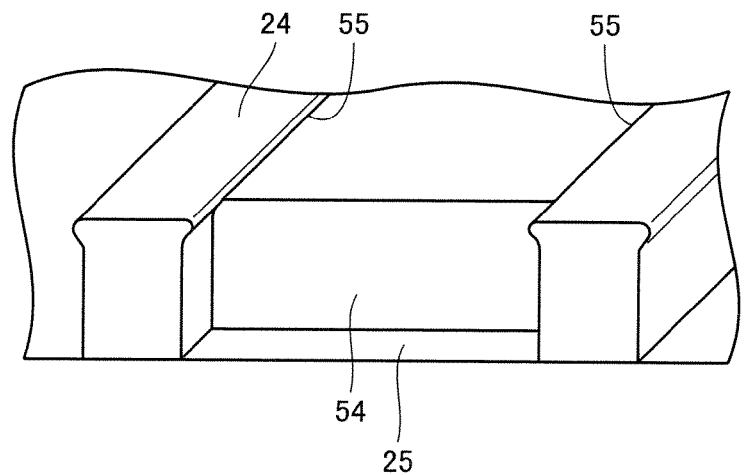
FIG. 8 is an enlarged view of the portion indicated by VIII in FIG. 2.
Figure 9:
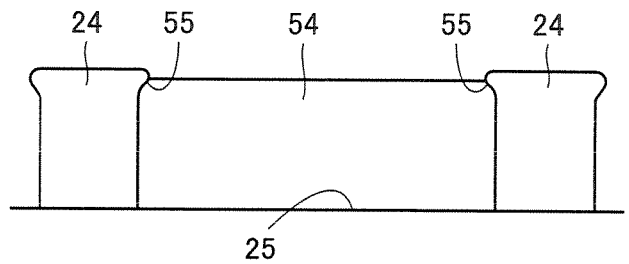
FIG. 9 is a side view of FIG. 8.

Referring to FIGS. 8 and 9, thick portion 24 may be melted in the state where pin terminal bottom portion 54 is arranged on thin portion 25, to let the molten resin of thick portion 24 cover the upper surface edge portion 55 of pin terminal bottom portion 54. This ensures that pin terminal 51 is firmly secured to mother case 11. Thick portion 24 may be heated directly, or may be heated by using supersonic wave, for melting.

Further, pin terminal bottom portion 54 may have a length shorter than the length of thick portion 24 to its tip end portion, to allow the molten resin of thick portion 24 to come around and cover the tip end portion of pin terminal bottom portion 54. This ensures that pin terminal bottom portion 54 is secured at top and bottom, left and right, and front and back with the molten resin of thick portion 24, and accordingly, pin terminal 51 can be secured still more firmly.

Furthermore, pin terminal bottom portion 54 may have a curved surface at the upper surface edge portion 55. In this case, the molten resin of thick portion 24 would readily cover upper surface edge portion 55, so that pin terminal 51 can be secured still more firmly. It is noted that a curved surface obtained when producing pin terminal 51 by pressing or the like may be used as upper surface edge portion 55, which facilitates formation of the curved surface of upper surface edge portion 55.

The power semiconductor package according to the present embodiment includes a base board 5, a semiconductor mounting substrate 1 rested thereon, a mother case 11 having an opening 13 and fixedly attached to base board 5 and thus containing semiconductor mounting substrate 1 therein, a securing member 21 having a plurality of securing positions 22 formed along a rim 12 constituting the opening 13, and screw terminals 31 and pin terminals 51 secured to rim 12 and electrically connected to semiconductor mounting substrate 1. Each of screw terminals 31 and pin terminals 51 is secured by securing member 21, at any one of the plurality of securing positions 22 thereof.

Figure 10:
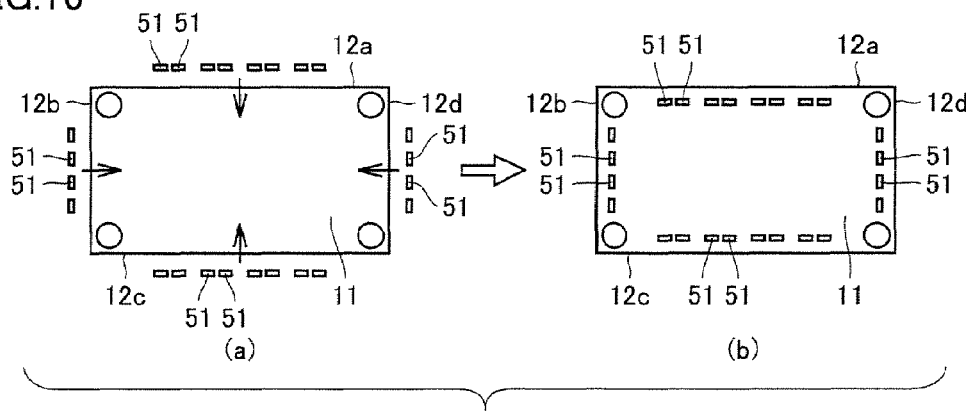
FIG. 10 is a top plan view showing the positions of the screw and pin terminals in the case where the package configuration is CIB, wherein (a) shows the state before arrangement of the terminals, and (b) shows the state after arrangement of the terminals.
Figure 11:
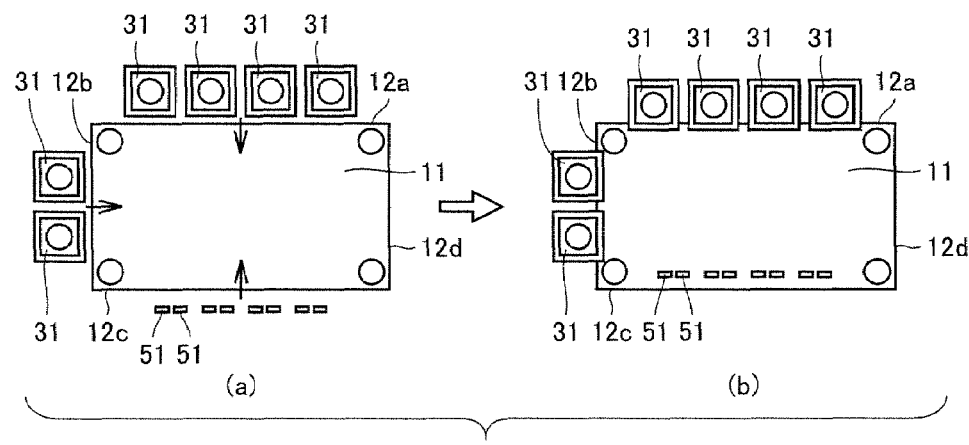
FIG. 11 is a top plan view showing the positions of the screw and pin terminals in the case where the package configuration is 7 in 1, wherein (a) shows the state before arrangement of the terminals, and (b) shows the state after arrangement of the terminals.
Figure 12:
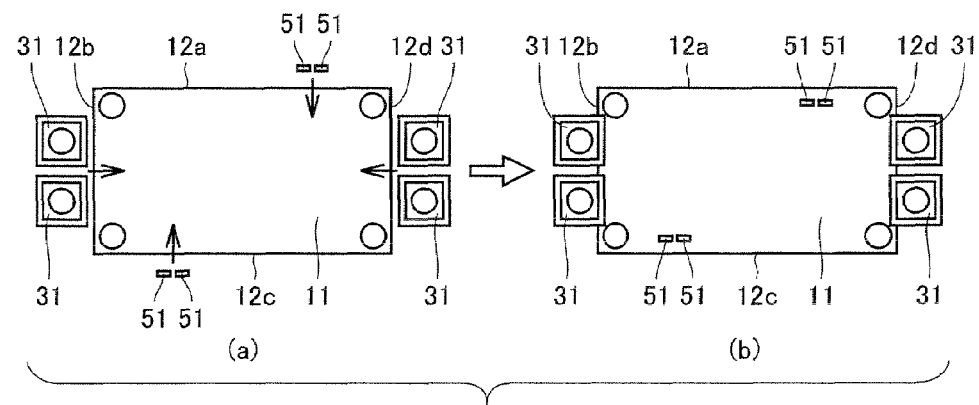
FIG. 12 is a top plan view showing the positions of the screw and pin terminals in the case where the package configuration is 2 in 1, wherein (a) shows the state before arrangement of the terminals, and (b) shows the state after arrangement of the terminals.
Figure 13:
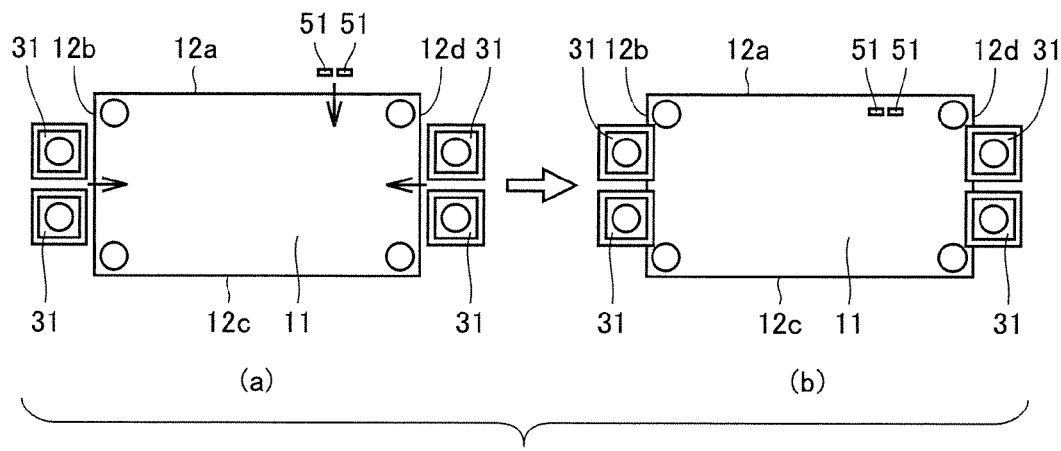
FIG. 13 is a top plan view showing the positions of the screw and pin terminals in the case where the package configuration is 1 in 1, wherein (a) shows the state before arrangement of the terminals, and (b) shows the state after arrangement of the terminals.

According to the power semiconductor package of the present embodiment, the terminal can be secured by securing member 21 at a desired securing position 22. Thus, the package can adapt to variation in shape and arrangement of the terminals, and accordingly, packages of various configurations become available. For example, if the package configuration is CIB, pin terminals 51 may be arranged on all sides 12a-12d of rim 12, as shown in FIGS. 10 (a) and (b). In the case of package configuration of 7 in 1, screw terminals 31 may be arranged on sides 12a and 12b, and pin terminals 51 may be arranged on side 12c, as shown in FIGS. 11(a) and (b). In the case of package configuration of 2 in 1, screw terminals 31 may be arranged on sides 12b and 12d, and pin terminals 51 may be arranged on sides 12a and 12c, as shown in FIGS. 12 (a) and (b). Further, in the case of package configuration of 1 in 1, screw terminals 31 may be arranged on sides 12b and 12d, and pin terminals 51 may be arranged on side 12a, as shown in FIGS. 13(a) and (b). In this manner, various packages can be configured by simply changing the numbers of screw terminals 31 and pin terminals 51 and by changing the securing positions 22 of the respective screw terminals 31 and pin terminals 51.

As a result, it is possible to suppress the cost required for prototyping of various packages and for manufacture of molds for mass-production thereof. Further, it is only necessary to address the problems associated with the package of one embodiment, which can prevent delay in development.

Still further, it is only necessary to verify the package of one embodiment, whereby time required for verification is reduced.

In addition, since screw terminals 31 and pin terminals 51 are secured to the rim 12 of mother case 11, it is unnecessary to arrange the terminals at the upper surface of mother case 11, i.e., above semiconductor mounting substrate 1. This can reduce the restriction on the layout inside mother case 11.

In the power semiconductor package of the present embodiment, rim 12 has sides 12a and 12c, and sides 12b and 12d, which are parallel to each other, respectively. The plurality of securing positions 22 are formed along sides 12a-12d. As such, securing positions 22 are arranged around the power semiconductor package of an approximately rectangular shape, which further increases the degree of freedom in arrangement of screw terminals 31 and pin terminals 51.

In the power semiconductor package of the present embodiment, securing member 21 has a plurality of wall portions 23a that extend in parallel with rim 12, and screw terminal 31 has a projection 38. Projection 38 is fitted to a groove formed by wall portions 23a and rim 12, to secure screw terminal 31. It is thus possible to secure screw terminal 31 by using the groove formed by wall portions 23a and rim 12. Further, pin terminal 51 may be configured to extend through a gap between the adjacent two wall portions 23a in the direction toward semiconductor mounting substrate 1.

In the power semiconductor package of the present embodiment, securing member 21 further has a plurality of connecting portions 23b connecting respective ones of the plurality of wall portions 23a to rim 12. As such, a plurality of securing positions 22 are defined by the spaces partitioned by the plurality of connecting portions 23b.

In the power semiconductor package of the present embodiment, securing member 21 further has a bottom portion 23c that extends perpendicular to the plurality of wall portions 23a, and that extends on one side of wall portions 23a opposite to the rim 12 side. This allows a part of the terminal to be arranged on bottom portion 23c.

In the power semiconductor package of the present embodiment, pin terminal 51 further has a pin terminal bottom portion 54 secured to bottom portion 23c. Projection 52 extends perpendicular to pin terminal bottom portion 54. As such, the external equipment and the package can be electrically connected via projection 52.

In the power semiconductor package of the present embodiment, bottom portion 23c has a thick portion 24 and a thin portion 25. Pin terminal bottom portion 54 is secured to thin portion 25, and thick portion 24 is melted to covert the upper surface edge portion 55 of pin terminal bottom portion 54. This allows pin terminal 51 to be secured firmly to mother case 11.

In the power semiconductor package of the present embodiment, screw terminal 31 extends from securing position 22 over rim 12 to the side portion of mother case 11. It is thus possible to leave the space above the mother case unoccupied, to thereby reduce the restriction on the layout inside mother case 11.

In the power semiconductor package of the present embodiment, screw terminal 31 has a screw terminal main body 35, a nut 34 secured to screw terminal main body 35, and an electrode 32 held by screw terminal main body 35 and electrically connecting nut 34 and semiconductor mounting substrate 1. As such, it is possible to electrically connect the external equipment and the package by screwing a bolt-shaped terminal into nut 34.

In the power semiconductor package of the present embodiment, projection 38 and screw terminal main body 35 are made of the same material. It is unnecessary to use electrode 32 as a projection, and accordingly, electrode 32 can be increase in area, allowing a large current to be supplied to screw terminal 31.

It is noted that the mother case of the present invention may be in a shape other than the approximately rectangular shape, which may be a circular shape, for example. Further, securing member 21 does not need to be formed along all four sides 12a-12d of rim 12. For example, it may be formed along only one of the four sides, e.g. 12a, or may be formed along only two sides 12a and 12d, or along only three sides 12a-12c. Furthermore, in the present embodiment, the power semiconductor package is structured with base board 5 on which semiconductor mounting substrate 1 is rested. Alternatively, semiconductor mounting substrate 1 may be fixedly attached directly to mother case 11, without using base board 5, or a structure having semiconductor mounting substrate 1 rested thereon may be provided integrally with mother case 11.

Second Embodiment

Figure 14:
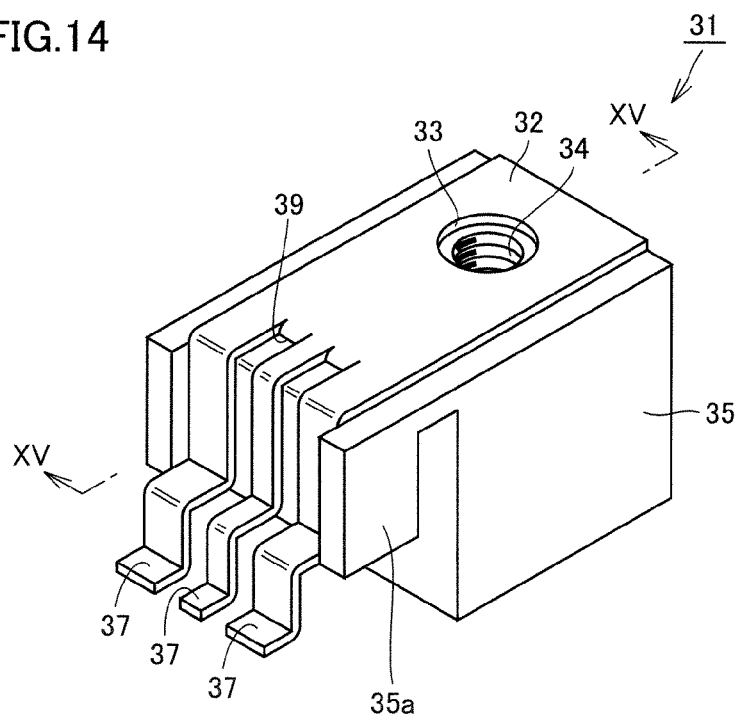
FIG. 14 is a perspective view showing a structure of a screw terminal according to a second embodiment of the present invention.
Figure 15:
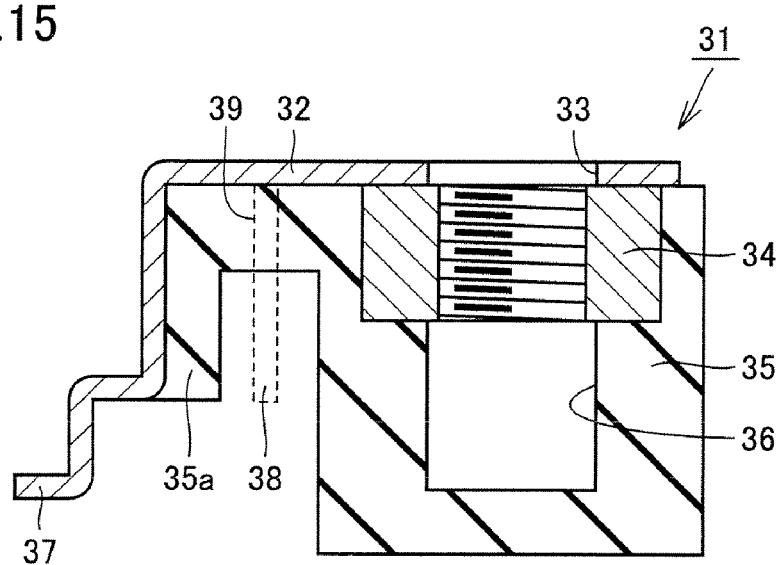
FIG. 15 is a cross sectional view taken along the line XV-XV in FIG. 14.

Referring to FIGS. 14 and 15, the screw terminal 31 of the present embodiment differs from the screw terminal shown in FIG. 4 in that the electrode 32 has a plurality of strips.

Electrode 32 formed with slits has three strips each having a tip end portion 37, with two projections 38 formed between the respective three strips. Screw terminal main body 35 has an opening 39 formed between its rectangular parallelepiped portion and overhanging portion 35a, and projections 38 branch off from electrode 32 downward to penetrate through opening 39. Projections 38 are formed by preparing a metal plate having a rectangular shape, making four cuts in the metal plate in the longitudinal direction from its tip end portion 37, and by bending the split portions. The remaining portions (strips) other than those constituting projections 38 are bent at positions different from projections 38, and their tip end portions 37 serving as electrodes contact semiconductor mounting substrate 1 (FIG. 2). No projection is formed at screw terminal main body 35. Projection 38 has a position and shape corresponding to securing position 22 (FIG. 2).

Otherwise, the structure of screw terminal 31 is identical to that of the screw terminal shown in FIG. 4, and therefore, the same members have the same reference characters allotted, and description thereof will not be repeated.

In the power semiconductor package of the present embodiment, electrode 32 has a plurality of strips each having a tip end portions 37, and projection 38 is formed between the strips. As such, it is possible to produce screw terminal 31 by using outsert molding alone, which facilitates manufacture of screw terminal 31. Further, projection 38 can be made of metal, which improves strength compared to the case where projection 38 is formed with resin. It also provides wider options for the material of screw terminal main body 35.

Third Embodiment

Figure 16:
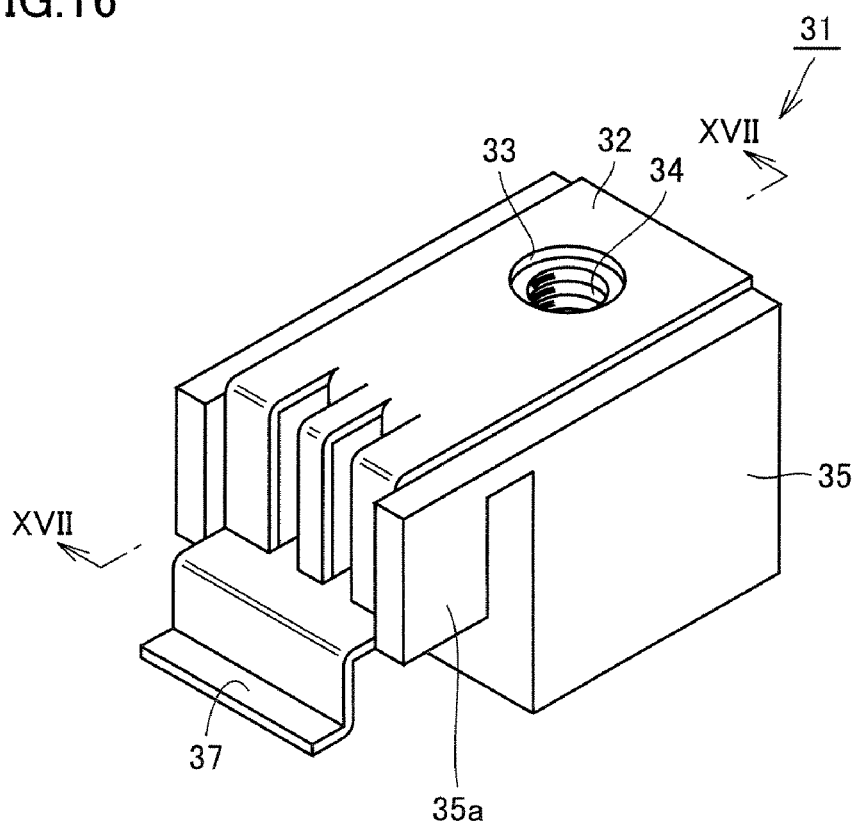
FIG. 16 is a perspective view showing a structure of a screw terminal according to a third embodiment of the present invention.
Figure 17:
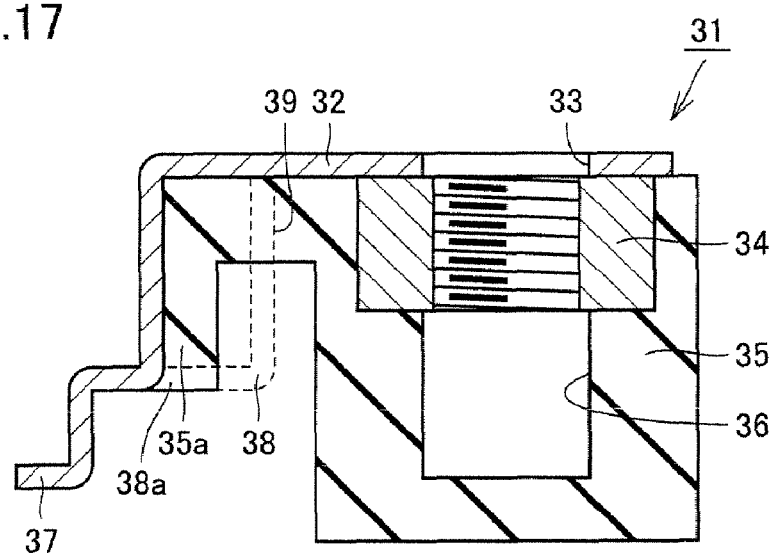
FIG. 17 is a cross sectional view taken along the line XVII-XVII in FIG. 16.

Referring to FIGS. 16 and 17, the screw terminal 31 of the present embodiment differs from the screw terminal of the second embodiment in that a tip end 38a of projection 38 is connected to electrode 32. Projection 38 branches off from electrode 32 downward to penetrate through opening 39 between the rectangular parallelepiped portion and overhanging portion 35a of screw terminal main body 35, and then extends in a horizontal direction so that its tip end 38a is connected to electrode 32.

Otherwise, the structure of screw terminal 31 is identical to that of the screw terminal shown in FIGS. 14 and 15, and therefore, the same members have the same reference characters allotted, and description thereof will not be repeated.

In the power semiconductor package of the present embodiment, tip end 38a of projection 38 is connected to electrode 32. As such, a current can be supplied to projection 38 as well, and thus, a large current can be supplied to screw terminal 31.

Fourth Embodiment

Figure 18:
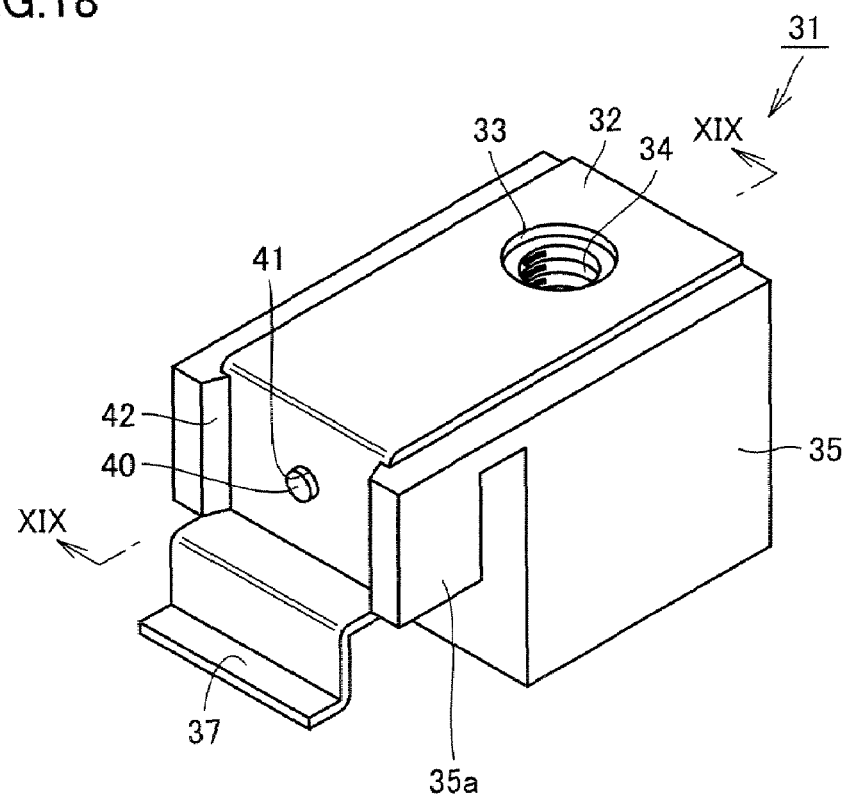
FIG. 18 is a perspective view showing a structure of a screw terminal according to a fourth embodiment of the present invention.
Figure 19:
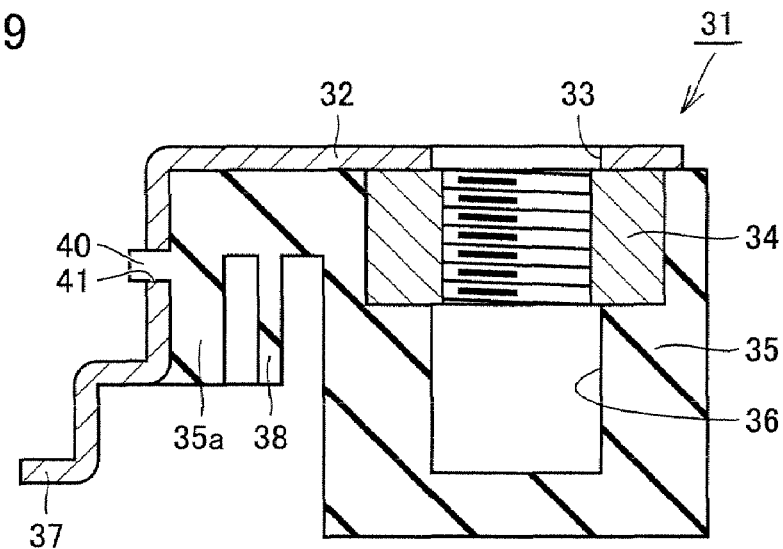
FIG. 19 is a cross sectional view taken along the line XIX-XIX in FIG. 18.

Referring to FIGS. 18 and 19, the screw terminal 31 of the present embodiment differs from the screw terminal in FIG. 4 in the way of securing electrode 32.

Electrode 32 is formed along the upper and side surfaces of screw terminal main body 35. A main body projection 40 is formed at the center of overhanging portion 35a of screw terminal main body 35, and electrode 32 has a hole 41 formed at a position corresponding to main body projection 40. Main body projection 40 is fitted into hole 41. Further, a stop 42 is formed at the side surface of overhanging portion 35a of screw terminal main body 35, and electrode 32 and stop 42 engage with each other. As such, electrode 32 is held by screw terminal main body 35.

Otherwise, the structure of screw terminal 31 is identical to that of the screw terminal shown in FIG. 4, and therefore, the same members have the same reference characters allotted, and description thereof will not be repeated.

In the power semiconductor package of the present embodiment, screw terminal main body 35 has a main body projection 40 and a stop 42, and electrode 32 has a hole 41. With main body projection 40 fitted in hole 41 and stop 42 engaged with electrode 32, electrode 32 is held by screw terminal main body 35. As such, it is possible to produce screw terminal 31 by outsert molding, without complicating the structure of electrode 32.

Figure 20:
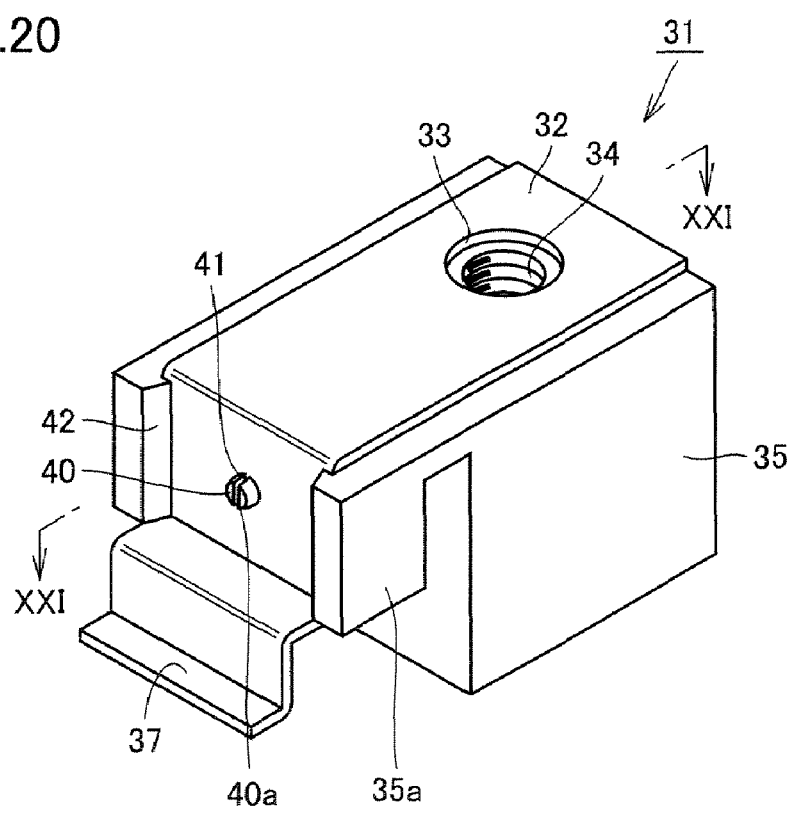
FIG. 20 is a perspective view showing a structure of a modification of the screw terminal according to the fourth embodiment of the present invention.
Figure 21:
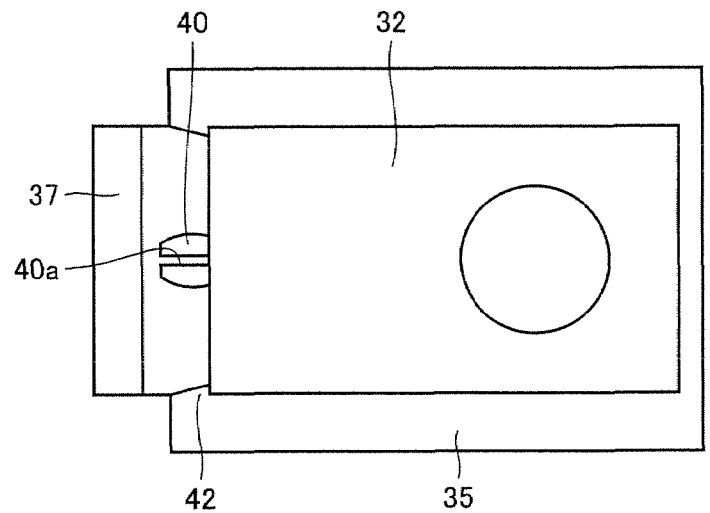
FIG. 21 is a top plan view of the screw terminal in FIG. 20.

It is noted that main body projection 40 of the present embodiment may be formed with a slit constituting a groove portion 40a, as shown in FIGS. 20 and 21, and the outer shape of main body projection 40 may be greater than hole 41. At the time of fitting main body projection 40 into hole 41, since the outer shape of main body projection 40 is greater than hole 41, the split parts of main body projection 40 are bent toward groove portion 40a (i.e., inward toward the slit) to be entered into hole 41. After main body projection 40 is inserted into hole 41, the split parts of main body projection 40 return to the original positions, so that main body projection 40 is held within hole 41.

With this configuration, screw terminal 31 can be produced by outsert molding, without complicating the structure of electrode 32.

In the power semiconductor package of the present embodiment, main body projection 40 has a slit, and the outer shape of main body projection 40 is larger than hole 41. At the time of fitting main body projection 40 into hole 41, main body projection 40 is forced inward to narrow the slit to be inserted into hole 41, and once main body projection 40 is inserted in hole 41, main body projection 40 is held within hole 41, since the outer shape of main body projection 40 is larger than hole 41. As such, it is readily possible to secure electrode 32 to screw terminal main body 35.

Fifth Embodiment

Figure 22:
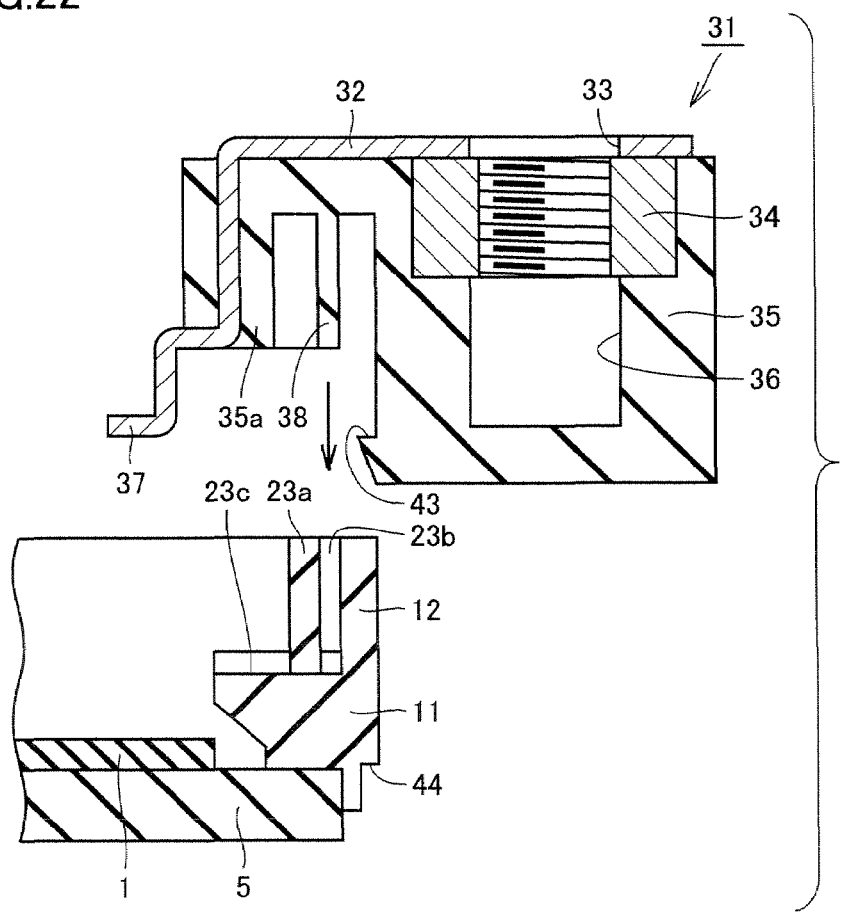
FIG. 22 is a cross sectional view showing structures of a screw terminal and a mother case according to a fifth embodiment of the present invention.

Referring to FIG. 22, in the present embodiment, the lower side surface of screw terminal main body 35 facing mother case 11 protrudes outward, and a step surface (first step surface) 43 is formed at the top surface of the protruding portion. Further, the lower side surface of mother case 11 facing screw terminal main body 35 is recessed inward, and a step surface (second step surface) 44 is formed at the ceiling surface of the recessed portion. Step surfaces 43 and 44 each have a normal line in the fitting direction (the arrow direction in FIG. 22) of projection 38, and contact each other face to face.

Otherwise, the structures of screw terminal 31 and mother case 11 are identical to those of screw terminal 31 and mother case 11 of the first embodiment, and therefore, the same members have the same reference characters allotted, and description thereof will not be repeated.

In the power semiconductor package of the present embodiment, screw terminal main body 35 has a step surface 43 having a normal line in the fitting direction of projection 38, and mother case 11 has a step surface 44 having a normal line in the fitting direction of projection 38. Step surfaces 43 and 44 contact each other, face to face, which prevents screw terminal 31 from coming off upward.

Sixth Embodiment

Figure 23:
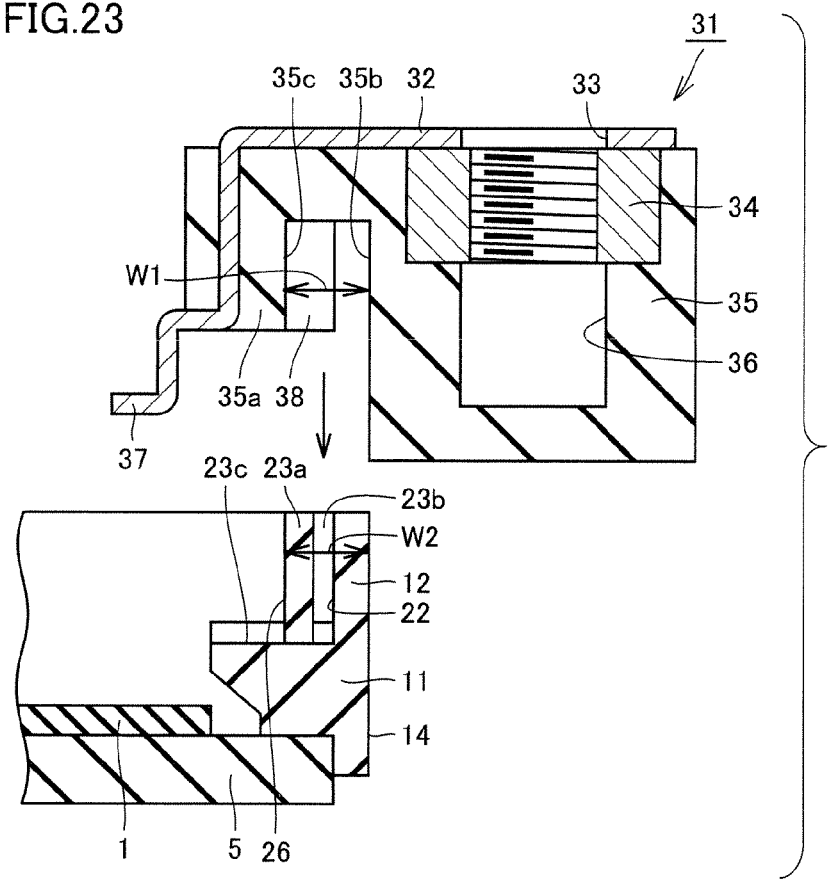
FIG. 23 is a cross sectional view showing a structure of a screw terminal according to a sixth embodiment of the present invention.
Figure 24:
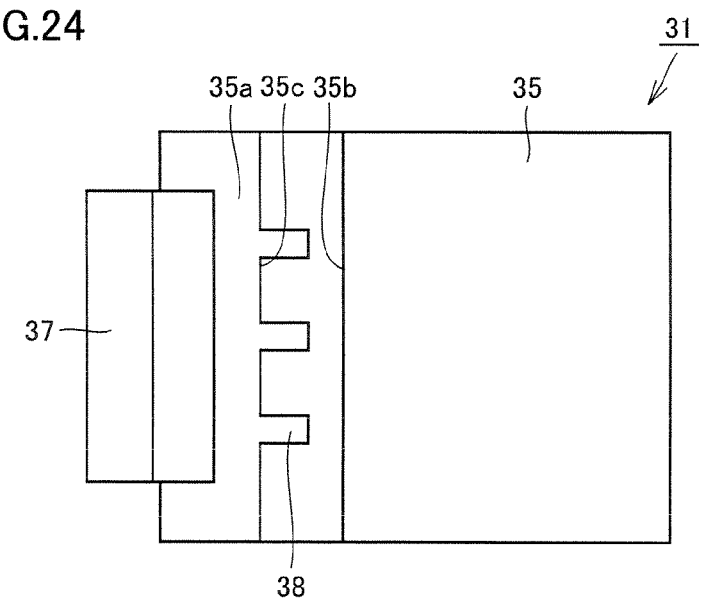
FIG. 24 is a bottom plan view of the screw terminal in FIG. 23.

Referring to FIGS. 23 and 24, in the screw terminal 31 of the present embodiment, a distance W1 between the side surface 35c of overhanging portion 35a and the side surface 35b of the rectangular parallelepiped portion facing each other is equal to a distance W2 between the side surface 26 of wall portion 23a and the side surface 14 of mother case 11. Further, projection 38 extends toward side surface 35b, and its tip end does not spread in the longitudinal direction in FIG. 24.

Screw terminal 31 of the present embodiment is fitted to securing member 21 and mother case 11 such that side surface 35c of overhanging portion 35a contacts side surface 26 of wall portion 23a and such that side surface 35b of the rectangular parallelepiped portion contacts side surface 14 of mother case 11. Further, projection 38 is inserted between the neighboring wall portions 23a to position screw terminal 31 in place.

Otherwise, the structure of screw terminal 31 is substantially identical to that of the screw terminal shown in FIG. 4, and therefore, the same members have the same reference characters allotted, and description thereof will not be repeated.

According to the power semiconductor package of the present embodiment, the shape of screw terminal 31, and hence, the shape of the mold for use in manufacturing screw terminal 31 can be simplified.

The semiconductor device of the present invention is suitable for a power semiconductor package used for inverter drive of industrial equipment and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor mounting substrate;
   an enclosure having an opening and containing said semiconductor mounting substrate therein;
   a securing member having a plurality of securing positions formed along a rim constituting said opening; and
   a terminal secured at said rim and electrically connected to said semiconductor mounting substrate,
   said terminal being secured by said securing member at one of said plurality of securing positions, whereby no terminals are secured at others of said securing positions.

2. The semiconductor device according to claim 1, wherein said rim has two pairs of sides parallel to each other, and said plurality of securing positions are formed along said two pairs of sides.

3. The semiconductor device according to claim 1, wherein said securing member has a plurality of wall portions extending parallel to said rim, and said terminal has a projection, and
said terminal is secured by fitting said projection into a groove formed by said plurality of wall portions and said rim.

4. The semiconductor device according to claim 3, wherein said securing member further has a plurality of connecting portions each connecting corresponding one of said plurality of wall portions to said rim.

5. The semiconductor device according to claim 3, wherein said securing member further has a bottom portion extending perpendicular to said plurality of wall portions and extending on one side of said wall portions opposite to the other side facing said rim.

6. The semiconductor device according to claim 5, wherein said terminal further has a terminal bottom portion secured to said bottom portion, and said projection extends perpendicular to said terminal bottom portion.

7. The semiconductor device according to claim 6, wherein said bottom portion has a thick portion and a thin portion, and said terminal bottom portion is secured to said thin portion, and said thick portion is melted to cover an upper surface edge portion of said terminal bottom portion.

8. The semiconductor device according to claim 3, wherein said terminal extends from said groove over said rim to a side portion of said enclosure.

9. The semiconductor device according to claim 3, wherein said terminal has a terminal main body, a nut secured to said terminal main body, and an electrode held by said terminal main body and electrically connecting said nut and said semiconductor mounting substrate.

10. The semiconductor device according to claim 9, wherein said projection and said terminal main body are formed with the same material.

11. The semiconductor device according to claim 9, wherein said electrode has a plurality of strips, and said projection is formed between said strips of said electrode.

12. The semiconductor device according to claim 11, wherein said projection has a tip end connected to said electrode.

13. The semiconductor device according to claim 9, wherein said terminal main body has a main body projection and a stop, and said electrode has a hole, and said electrode is held by said terminal main body by fitting of said main body projection in said hole and by engagement of said stop with said electrode.

14. The semiconductor device according to claim 13, wherein said main body projection has a slit and has an outer shape greater than said hole, and at the time of fitting said main body projection into said hole, said main body projection is forced inward to narrow said slit and inserted into said hole, and after said main body projection is inserted in said hole, said main body projection returns to its original position and is held within said hole.

15. The semiconductor device according to claim 9, wherein said terminal main body has a first step surface having a normal line in the fitting direction of said projection, and said enclosure has a second step surface having a normal line in the fitting direction of said projection, and said first and second step surfaces contact each other face to face.

* * * * *